United States Patent [19]

Narita et al.

[11] Patent Number: 4,812,897
[45] Date of Patent: Mar. 14, 1989

[54] SEMICONDUCTOR ELEMENT SEALING STRUCTURE

[75] Inventors: Ryoichi Narita, Obu; Toshio Sonobe, Okazaki; Hitoshi Ito, Kariya; Junji Ishikawa, Nagoya; Osamu Takenaka, Kariya; Junji Sugiura, Toyota, all of Japan

[73] Assignee: Nippondenso Co., Ltd., Aichi, Japan

[21] Appl. No.: 93,159

[22] Filed: Sep. 1, 1987

Related U.S. Application Data

[63] Continuation of Ser. No. 910,988, Sep. 24, 1986, abandoned.

[30] Foreign Application Priority Data

Sep. 27, 1985 [JP] Japan ............................ 60-215277

[51] Int. Cl.⁴ .................. H01L 23/28; H01L 23/02; B32B 27/38; B32B 9/04; C08F 8/00; C08F 283/00; C08G 8/28
[52] U.S. Cl. .............................. 357/72; 357/74; 428/413; 428/447; 525/477; 525/504; 525/131
[58] Field of Search ............. 357/72, 74; 428/413, 428/447; 525/477, 504, 131

[56] References Cited

U.S. PATENT DOCUMENTS

| 3,906,144 | 9/1975 | Wiley | 357/72 |
| 4,159,221 | 6/1979 | Schuessler | 357/74 |
| 4,163,072 | 7/1979 | Soos | 357/72 |
| 4,190,855 | 2/1980 | Inoue | 357/72 |
| 4,558,510 | 12/1985 | Tani et al. | 357/72 |
| 4,582,762 | 4/1986 | Onohara et al. | 428/413 |

FOREIGN PATENT DOCUMENTS

| 58-10841 | 1/1983 | Japan | 357/72 |
| 60-157241 | 8/1985 | Japan | 357/72 |

Primary Examiner—Andrew J. James
Assistant Examiner—Gregory Key
Attorney, Agent, or Firm—Cushman, Darby & Cushman

[57] ABSTRACT

A semiconductor element mounted on a substrate is sealed with a silicone gel which has a complex modulus of elasticity such that breakage of solder bumps due to thermal fatique occurs preferentially by shear stress thereto due to a difference between thermal expansion coefficients of the semiconductor element and the substrate, not by tension thereto due to thermal expansion of the silicone gel between the semiconductor element and the substrate.

14 Claims, 4 Drawing Sheets

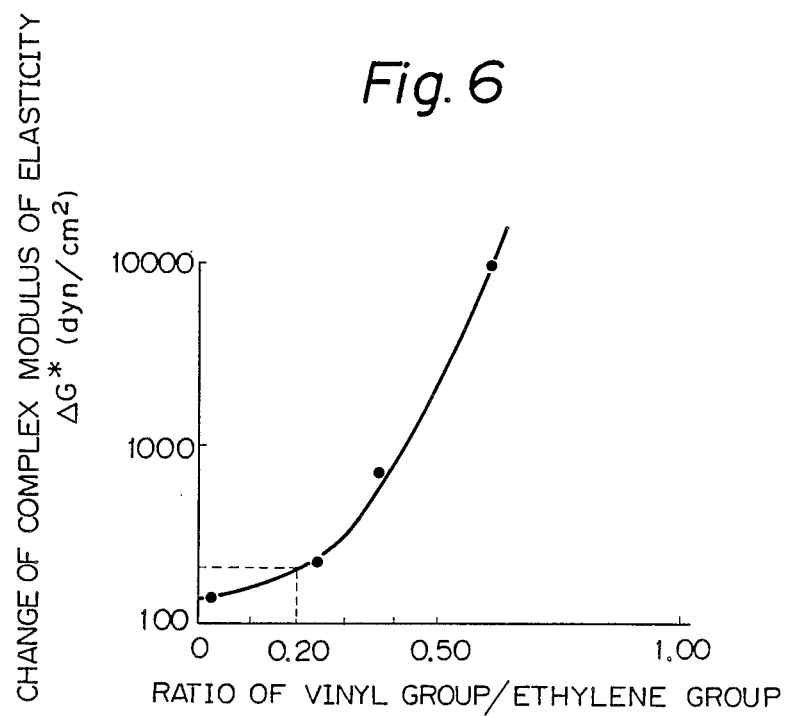

SEMICONDUCTOR ELEMENT SEALING STRUCTURE

This is a continuation of application Ser. No. 910,988, filed Sept. 24, 1986, which was abandoned upon the filing hereof.

BACKGROUND OF THE INVENTION

1. Field of the Invention

The present invention relates to a semiconductor element sealing structure used mainly for sealing a semiconductor element such as a flip-chip mounted on a hybrid substrate, to prevent breakage of the chip or chip connecting portion and to allow an increase of the size of the chip.

2. Description of the Related Art

Heretofore, a semiconductor chip is sealed with silicone gel or the like to electrically insulate and protect the chip from environmental hazards such as water, shock, and vibration. In a hybrid IC (integrated circuit), a flip-chip, for example, is mounted on a conductor pattern formed on a thick layer printed substrate with soldering bumps formed on a main surface of the flip-chip. The flip-chip and the substrate are packed with silicone gel. The silicone gel entering a space between the flip-chip and the printed substrate is thermally expanded by the effect of the ambient temperature and self-generation of heat by various elements on the printed substrate, to pull up the flip-chip, and finally result in a breakage of the soldering bumps. We found that this phenomenon becomes more important as the size of a chip is increased, since the force pushing up the chip becomes larger.

Further, as is well known, silicone gels used for the above purpose contain unreacted vinyl groups and such vinyl groups will cause additional reactions with some ingredients of another addition reaction type silicone adhesive, for example, an adhesive used for adhering a cap to a case in which the chip has been sealed, and form additional cross linkages in the sealing silicone gel or increase the cross linkage density, thereby increasing the hardness of the silicone gel and thus accelerating the action of pushing up the chip. Silicone gels in which the hardness of the silicone gel will not change over a period of time, and in which the additional cross linking reaction of unreacted vinyl groups is improved, have been proposed. But even these silicone gels have a high original hardness and thus increase the force pushing up the chip, resulting in cracks or breakage of the flip-chips or breakage of the soldering bumps. Accordingly, these silicone gels limit the size of a chip which can be used.

SUMMARY OF THE INVENTION

The object of the present invention is to eliminate the above described problems of the prior art and to provide a sealing structure in which a semiconductor element is sealed with a silicone gel and which prevents breakage of the semiconductor element or soldering bumps and allows an increase in the size of the element used.

The above and other objects are attained by a semiconductor element sealing structure comprising: (a) a semiconductor element having electrodes on a-main surface thereof; (b) a substrate having conductive members formed on the substrate, the semiconductor element being mounted on the substrate by bonding the electrodes to the conductive members with soldering bumps; and (c) an addition reaction type silicone gel sealing at least the semiconductor element and existing also between the semiconductor element and the substrate. This silicone gel has: (i) a complex modulus of elasticity such that breakage of the bumps due to thermal fatigue occurs preferentially by shear stress thereon due to a difference between the thermal expansion coefficients of the semiconductor element and the substrate, not by tension thereto due to thermal expansion of the silicone gel between the semiconductor element and the substrate; and preferably, (ii) a ratio of free vinyl groups to ethylene groups such that an increased complex modulus of elasticity of the silicone gel after the free vinyl groups have been used to form cross linkages is still lower than the complex modulus of elasticity.

The present invention resides in the finding that the pushing-up stress on the semiconductor element due to thermal expansion of a silicone gel has a close relationship with the complex modulus of elasticity of the silicone gel used, and the breakage of a semiconductor element or soldering bumps, even in an element having a large size, can be prevented by reducing the complex modulus of elasticity of a silicone gel if a specific semiconductor element is mounted onto a specific substrate with specific soldering bumps and if a temperature range in which the above specified structure is to be used is given. In the sealing structure according to the present invention, the complex modulus of elasticity of a silicone gel is so low that bumps are broken by repeated shear stress due to the difference between thermal expansion coefficients of a semiconductor element and a substrate, not by repeated tension due to thermal expansion of a silicone gel between the semiconductor element and th substrate. In corresponding sealing structures in the prior art, soldering bumps or a semiconductor element are broken due to repeated thermal expansion of a silicone gel between the semiconductor element and a substrate, but the life-time of the sealing structure is satisfactory because the size of a semiconductor element is relatively small, such as 3 mm square or so, so that soldering bumps or a semiconductor element are not broken due to repeated thermal expansion of a silicone gel prior to damage or breakage of a semiconductor element, per se, due to causes other than a repeated thermal expansion of a silicone gel. However, if the size of a semiconductor element is increased, soldering bumps or a semiconductor element may be easily broken due to repeated thermal expansion of a silicone gel prior to damage or breakage of a semiconductor element for other reasons. Thus, reduction of the repeated tension due to thermal expansion of a silicone gel becomes necessary in a sealing structure using a relatively large semiconductor element.

Further, according to a preferred embodiment of the present invention, a silicone gel sealing a semiconductor element must not contain too large an amount of free or unreacted vinyl groups. This is to prevent an increase of the complex modulus of elasticity of a silicone gel over the above-defined upper limit after the free or unreacted vinyl groups have reacted, after time has lapsed, with some other addition reaction type material and so the silicone gel becomes harder or the complex modulus of elasticity thereof is increased. We found that the increase of the complex modulus of elasticity of an addition reaction type silicone gel depends on the ratio of free or unreacted vinyl groups to ethylene groups. Therefore, by reducing the ratio of free or unreacted vinyl groups to ethylene groups, the over-increase of the complex modulus of elasticity of a silicone gel can be prevented.

We found that the above-mentioned upper limit of the complex modulus of elasticity of a silicone gel may be determined by the following formula:

$$\log_e S = K \cdot \log_e(G^* - B) + A$$

where
- $G^*$ is the upper limit of the complex modulus of elasticity;
- S is the area of the main surface of the semiconductor element;
- K is a constant defined by the number, size and material of the bumps;
- A is a constant defined by the temperature change width around the semiconductor element; and
- B is a correction factor.

BRIEF DESCRIPTION OF THE DRAWINGS

FIG. 6 shows the relationship between the complex modulus of elasticity of a silicone gel and the ratio of vinyl groups to ethylene groups.

DESCRIPTION OF THE PREFERRED EMBODIMENTS

Figure 1:
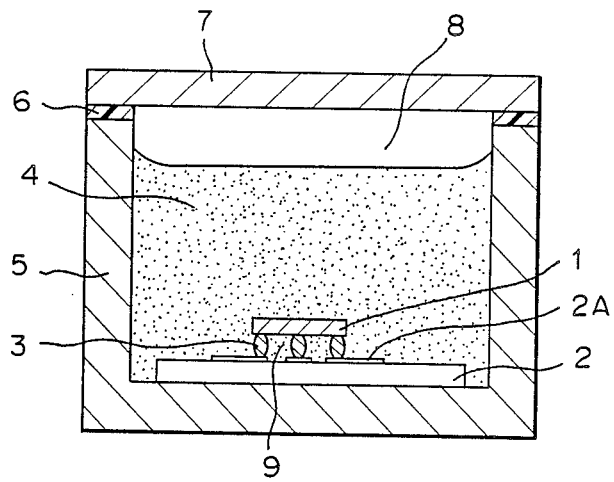
FIG. 1 is a sectional view of an example of a sealing structure according to the present invention.

In an embodiment of the present invention, a silicone resin in the form of gel is used as an addition reaction type material for sealing a semiconductor element. FIG. 1 shows a general structure of a hydrid IC to which the present invention is applied. In the figure, reference number 1 denotes a flip-chip IC on a main surface of which soldering bumps 3 are formed, and reference numeral 2 denotes a thick layer circuit board on which a predetermined conductor pattern 2A is formed, the flip-chip IC 1 being soldered to a given portion of the conductor pattern 2A. Reference numeral 4 denotes a silicone gel as a sealing material, 5 a case made of a resin or metal, 6 an addition reaction type silicone adhesive, 7 a cap made of a resin or metal, 8 a space of air or resin, and 9 a gap between the flip-chip IC 1 and the circuit board 2 wherein the silicone gel 4 is filled.

Figures 2A, 2B, 2C:
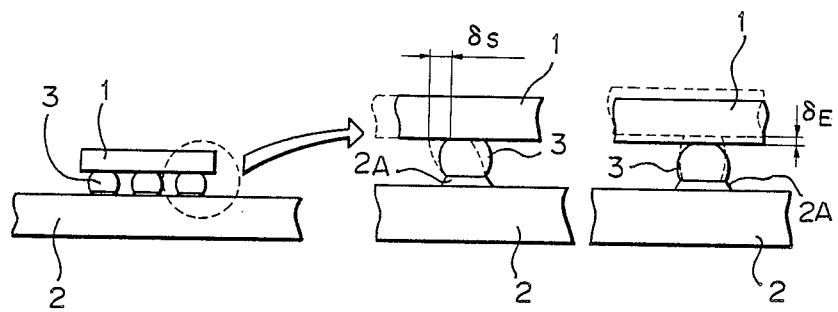
FIGS. 2A, 2B, and 2C are schematical side views of a sealing structure, for explaining shearing strain and tensile strain produced by thermal stress in a portion of an IC chip and bumps.

This structure of the hydrid IC generally suffers repeated temperature cycles due to surrounding temperature changes and the self generation of heat, and the strains caused by the repeated thermal stresses affect the flip-chip IC 1. As seen in FIGS. 2A, 2B and 2C, this thermal strain comprises shear strain $\delta_S$ produced by a difference between thermal expansion coefficients of the flip-chip IC 1 and the circuit board 2, as well as tensile strain $\delta_E$ produced by thermal expansion of the silicone gel 4 inserted into the gap having the height of the bumps 3 between the flip-chip IC 1 and the circuit board 2, to push up the flip-chip IC 1. The shear strain $\delta_S$ and the tensile strain $\delta_E$ increase with the increase of the chip size of the flip-chip IC 1. However, the strain which causes cracking of the flip-chip IC 1 or breakage of the soldering bumps 3 is the tensile strain $\delta_E$. As a result, the first mode of breakage of the soldering bumps 3 occurs due to pushing-up the flip-chip IC 1 by thermal expansion of the silicone gel 4 directly below the flip-chip IC 1. This is true even when the flip-chip IC 1 has a small chip size in a sealing structure in the prior art, as described before.

According to the present invention, the force from the silicone gel 4 pushing up the chip 1 is reduced in such a way that breakage due to the shear strain $\delta_S$ appears prior to breakage due to the tensile strain $\delta_E$. Accordingly, enlargement of the chip 1 and extension of the thermal fatigue life of the soldering bumps 3 due to repeated temperature cycles can be attained, and as a result, higher and multiplied functions can be attained in a single chip and the reliability of the whole device involving the sealing structure can be increased.

To attain a reduction of the force pushing up a chip, an investigation of the characteristics of gels was necessary, since even silicone gels having the same penetration produced different forces when pushing up a chip.

We investigated this problem with the following formula, which is derived from a theoretical viscoelasticity analysis in which flow, deformation and the like of various elastic viscous materials are analysed.

$$F = f(G^*, S, \Delta T, \beta, H, C_T)$$
$$= a(G^* - B)^c \cdot S^b \cdot \Delta T \cdot \beta \cdot H^d \cdot C_T^e$$

where F is the force pushing up the flip-chip IC 1, $G^*$ represents the hardness of the gel 4, S the area of the flip-chip IC 1, $\Delta T$ the width of temperature change around the flip-chip IC 1, $\beta$ the thermal expansion coefficient of the gel 4, H the distance between the flip-chip IC 1 and the thick layer printed substrate 2, $C_T$ a time constant of the temperature increase, and a, b, c, d, e, and B are constants. This formula shows that the pushing up force F can be calculated if $G^*$ representing the hardness of the gel 4, i.e., the complex modulus of elasticity $G^*$ concerning the Young modulus and the viscosity of the gel 4 is determined.

Accordingly, we investigated the possibility of application of the complex modulus of elasticity $G^*$, the characteristic used in the field of rheology, to the characterization of the gel. The measurement of the complex modulus of elasticity $G^*$ of a gel was carried out as shown below.

Figure 3A:
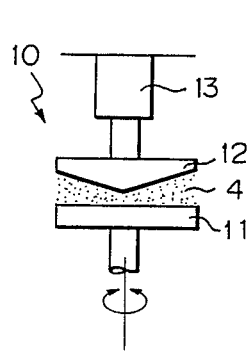
FIG. 3A shows a method of measuring a complex modulus of elasticity.
Figure 3B:
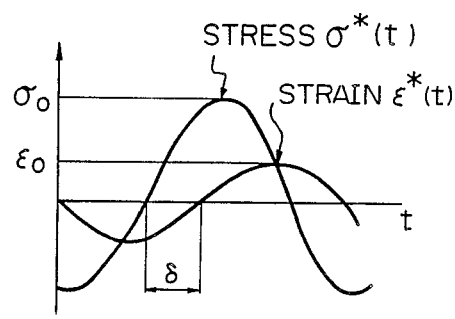
FIG. 3B shows a mode of a complex modulus of elasticity.

Referring to FIG. 3A, a gel 4 is charged between a plate 11 and a cone 12 of a measuring unit 10 and heat cured under a standard curing condition for the gel and then cooled to 30° C. The plate 11 is then vibrated at an amplitude of 4° and a frequency of 1 Hz. As a result, the force was transmitted to a torque detector 13 through the cone 12. The mode of transmission of the force is shown in FIG. 3B. In this figure or mode, a relationship $\delta^*(t) = G^* \cdot \epsilon^*(t)$ is present between the applied strain $\epsilon^*(t)$ and the resultant stress $\delta^*(t)$. This $G^*$ in the just above formula is defined as the complex modulus of elasticity of the gel 4.

Figure 4:
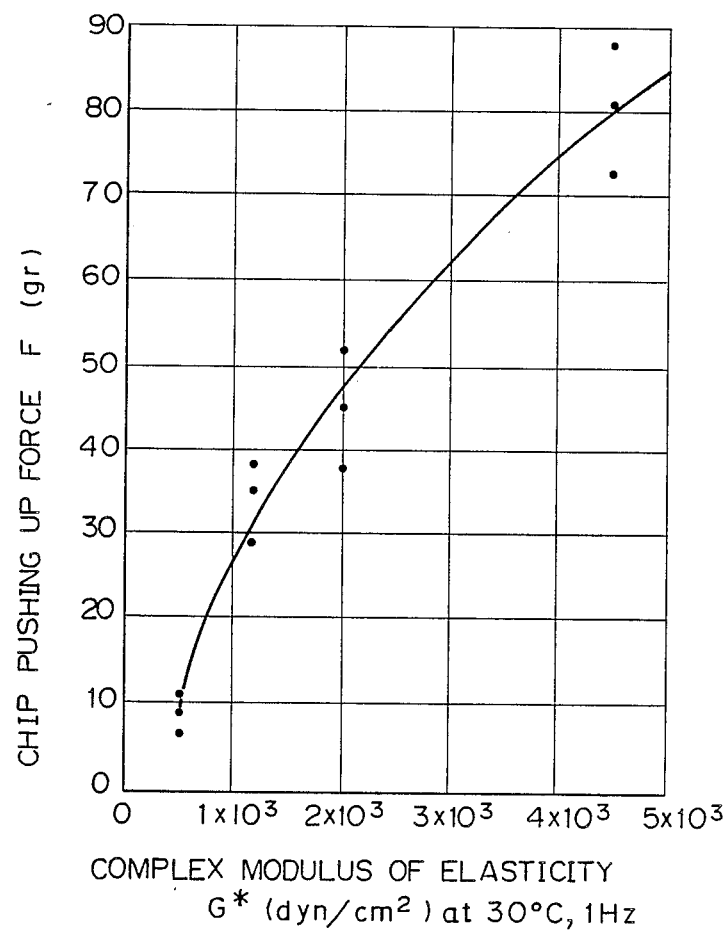
FIG. 4 shows a relationship between the chip-pushing up force and the complex modulus of elasticity.

The relationship between the above defined complex modulus of elasticity (at 30° C. and 1 Hz) and the pushing up force F was examined and a typical example of this relationship obtained in a specific sealing structure under a constant temperature change is shown in FIG. 4. As seen in FIG. 4, the relationship obtained in the experiment showed good coincidence with the theoretical corresponding relationship. Thus, it was shown that the pushing up force F can be expressed by the formula $$F = f(G^*, S, \Delta T, B, H, C_T).$$

Figure 5:
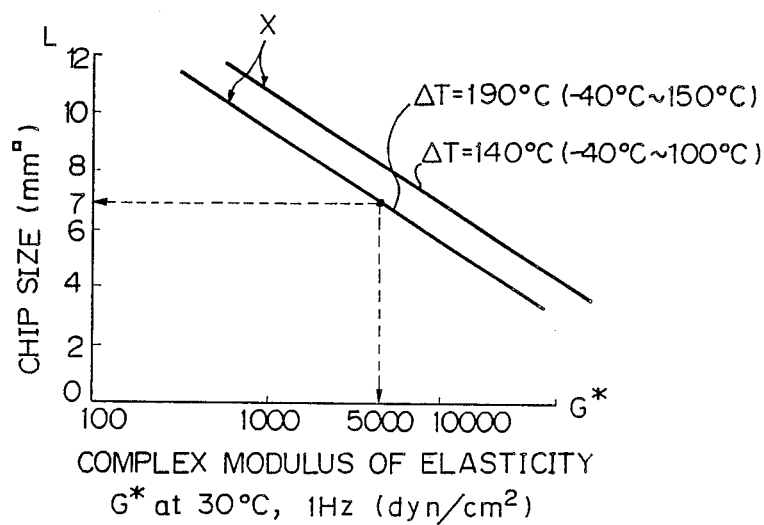
FIG. 5 shows the relationship between the complex modulus of elasticity of a sealing material and the chip size.

From the above finding, the relationships between the size of an IC chip and the upper limit of the applicable complex modulus of elasticity $G^*$ (at 30° C. and 1 Hz) of a gel were obtained, by considering the thermal surrounding conditions of a hybrid IC for a an automobile and various factors or data of an appropriate IC chip and the mounting thereof to a substrate. The relationships are shown in FIG. 5. The lines or functions X in FIG. 5 are generally expressed by the following formula.

$$\log_e S (= \log_e L^2) = K \cdot \log_e (G^* - B) + A$$

where S is the area of a chip, L the size of a chip, K a constant based on the number, shape and material of bumps, A a constant based on the width of the temperature change around a chip, the time constant of temperature increase, the thermal expansion coefficient of a gel and the distance between a chip and a substrate, and B a correction constant. The specific lines or functions X in FIG. 5 are expressed as $$\log_e S = \log_e L^2 = -0.3 \cdot \log_e (G^* - 450) + A$$

$$A = 9.26 - (\log_e \Delta T)/1.85,$$

where $\Delta T$ denotes the width of the temperature change.

Although the shape of soldering bumps 3 may be spherical, pillar-like, or otherwise, the diameter and height of the soldering bumps 3 are designed appropriately to fit the size of a chip used. These factors should usually be designed in a limited range and thus should be considered as a constant parameter which affects the pushing up force F. IC's mounted in automobiles suffer a rigorous temperature environment in comparison with IC's for consumer appliances. The width of temperature change $\Delta T$ max of IC's mounted in automobiles may be as high as 200° C., considering the type of solder used (high or low melting point solder) and the Curie point at which a semiconductor loses its semiconductive characteristics. If a silicone gel is not used and air is present between the IC chip 1 and the printed board 2, the maximum size of an IC chip which may be used, considering breakage thereof due to the shear strain $\epsilon_S$, is usually assumed to be 7 to 9 mm□. Thus, if the size of an IC chip is assumed to be 7 mm□, as the worst case, the upper limit of the complex modulus of elasticity $G^*$ at which the IC chip or the soldering bumps would not be broken by the pushing up force due to a gel inserted between the IC chip and the substrate, and at which the soldering bumps would be broken by the shear strain, is obtained as about 5000 dyn/cm² from FIG. 5. On the other hand, the ower limit of the complex modulus of elasticity is obtained as about 500 dyn/cm². Such a minimum hardness (viscosity) or complex modulus of elasticity $G^*$ is necessary for the workability of the step of sealing with a gel as well as the stability of a gel against vibration etc. suffered after potting. Thus, usually, a gel having the complex modulus of elasticity $G^*$ of about 500 to 5000 dyn/cm², preferably 500 to 3000 dyn/cm² considering the dispersion of various factors, can be used to attain the object of the present invention.

Next, we investigated the change of the complex modulus of elasticity $G^*$ after the lapse of time. The complex modulus of elasticity $G^*$ of a silicone gel, an addition reaction type compound, is changed or increased by reaction with another addition reaction type material such as an adhesive 6 for bonding a cap 7 to a case 5, when the silicone gel is actually used under various environmental conditions. A catalyzed addition reaction type silicone gel is made from a siloxane containing vinyl groups for forming a skeleton, a hardening agent containing hydrosilyl groups and reacting with the vinylsiloxanes to become a part of a skeleton and to form ethylene groups from the vinyl groups and the hydrosilyl groups, and a catalyst such as platinum for catalyzing the reaction between the polssiloxane and the hardening agent. Such a Pt-catalyzed addition reaction type silicone gel contains unreacted vinyl groups, which cause an increase of the cross linking density by reaction with other ingredients to form an additional cross linkage.

FIG. 6 shows the relationship between the change of the complex modulus of elasticity $G^*$ of a silicone gel and the ratio of vinyl groups ($-CH=CH_2$) to ethylene groups ($-CH_2-CH_2-$) in the silicone gel, obtained by experiment. This silicone gel had an original complex modulus of elasticity $G^*$ of about 3000 dyn/cm² and was placed in a gas of an addition reaction type silicone adhesive which is used for assembling a hybrid IC. A similar figure or relationship between the above two could be obtained with difference adhesives, although the figure or the characteristic was shifted slightly up or down. The lower the degree of change of the complex modulus of elasticity $G^*$, the more stable the silicone gel. According to the present invention, the change of the complex modulus of elasticity after time had lapsed, or the ratio of vinyl groups to ethylene groups, is selected such that the complex modulus of elasticity $G^*$ after increase is still lower than the upper limit of the complex modulus of elasticity $G^*$ defined previously. Here, generally speaking, from FIG. 5, it is desirable to reduce the change of the complex modulus of elasticity $G^*$ to within a range of ±10% of the before-stated 5000 dyn/cm², which prevents breakage of the soldering bumps or a chip due to pushing up fatigue, i.e., within several hundred dyn/cm². Therefore, from FIG. 6, a silicone gel having a ratio of vinyl groups to ethylene groups of equal to or lower than 0.20 is very suitable, in a sealing structure according to the present invention.

As described above, according to the present invention, a sealing material for a semiconductor element has a low complex modulus of elasticity and a low content of a remaining vinyl group and so a sealed semiconductor element, particularly one used for automobiles in which the circumstance surrounding the semiconductor are severe, can have a high reliability.

Although the present invention is described using an embodiment in which a silicone gel sealing a semiconductor element is not in contact with an addition reaction type silicone adhesive, which changes the complex modulus of elasticity of the silicone gel. The present invention can be applied to other embodiments, for example, when only an IC chip is coated with a silicone gel which is then sealed with another addition reaction type silicone material, etc.

When a semiconductor element is an IC chip using wire bonding, or as flat package type, the IC chip will not be broken since the tension on the wire or the frame is reduced by using a silicone gel having a low complex modulus of elasticity and a low content of a remaining vinyl group.

We claim:

1. A semiconductor element sealing structure comprising:
   (a) a semiconductor element having electrodes on a main surface thereof;
   (b) a substrate having conductive members formed on the substrate, the semiconductor element being mounted on the substrate by bonding the electrodes to the conductive members with solder bumps; and
   (c) an addition reaction type silicone gel sealing at least the semiconductor element and also existing between the semiconductor element and the substrate, said silicone gel having a complex modulus of elasticity lower than an upper limit G* determined by the following formula:

$$\log_e S = K \cdot \log_e(G^* - B) + A$$

where
   G* is the upper limit of the complex modulus of elasticity;
   S is the area of the main surface of the semiconductor element;
   K is a constant defined by the number, size and material of the solder bumps;
   A is a constant defined by the temperature change width around the semiconductor element; and
   B is a correction factor.

2. A structure according to claim 1, wherein said formula is $\log_e S = -0.3 \cdot \log_e(G^* - 450) + A$, where A denotes the temperature change width.

3. A structure according to claim 1, wherein said silicone gel contains vinyl groups and ethylene groups and the ratio of the free vinyl groups to the ethylene groups such that an increased complex modulus of elasticity of the silicone gel after the free vinyl groups have been used to form cross linkages is still lower than the upper limit G* of the complex modulus of elasticity.

4. A structure according to claim 1, wherein said structure is used under a condition of a temperature change width of up to 200° C.

5. A structure according to claim 1, wherein said semiconductor element is a flip-chip, said substrate is a thick layer printed board having a conductive pattern, and said flip-chip is mounted on said thick layer printed board by soldering.

6. A structure according to claim 1, further comprising a case, wherein said case contains said semiconductor element and said substrate therein and said silicone gel is filled in said case and seals at least said semiconductor element.

7. A semiconductor element sealing structure comprising:
   (a) a semiconductor element having electrodes on a main surface thereof;
   (b) a substrate having conductive members formed on the substrate, the semiconductor element being mounted on the substrate by bonding the electrodes to the conductive members with solder bumps; and
   (c) an addition reaction type silicone gel sealing at least the semiconductor element and also existing between the semiconductor element and the substrate, said silicone gel having a complex modulus of elasticity in a range of 500 to 5000 dyn/cm$^2$ determined at 30° C. and 1 Hz.

8. A structure according to claim 1, wherein said silicone gel contains vinyl groups and ethylene groups and the ratio of the free vinyl groups to the ethylene groups is such that an increased complex modulus of elasticity of the silicone gel after the free vinyl groups have been used to form cross linkages is still lower than 5000 dyn/cm$^2$ at 30° and 1 Hz.

9. A structure according to claim 7, wherein said structure is used under a condition or a temperature change width up to 200° C.

10. A structure according to claim 7, wherein said ratio of free vinyl group to ethylene groups in the silicone gel is equal to or lower than 0.20.

11. A structure according to claim 1, wherein said semiconductor element is a flip-chip, said board is a thick layer printed substrate having a conductive pattern, and said flip-chip is mounted on said thick layer printed board by soldering.

12. A structure according to claim 7, further comprising a case, wherein said case contains said semiconductor element and said substrate therein and said silicone gel is filled in said case and seals at least said semiconductor element.

13. A structure according to claim 7, wherein said complex modulus of elasticity is in a range of 500 to 3000 dyn/cm$^2$ at 30° C. and 1 Hz.

14. A semiconductor element sealing structure comprising:
   (a) a semiconductor element having electrodes on a main surface thereof;
   (b) a substrate having conductive members formed on the substrate, the semiconductor element being mounted on the substrate by bonding the electrodes to the conductive members with solder bumps; and
   (c) an addition reaction type silicone gel sealing at least the semiconductor element and also existing between the semiconductor element and the substrate, said silicone gel having a complex modulus of elasticity
   such that breakage of the bumps due to thermal fatigue occurs preferentially by shear stress thereto due to a difference between the thermal expansion coefficients of the semiconductor element and the substrate, not by tension thereto due to thermal expansion of the silicone gel between the semiconductor element and the substrate, and
   said silicone gel contains free vinyl groups and ethylene groups and the ratio of the free vinyl groups to the ethylene groups is such that an increased complex modulus of elasticity of the silicone gel after the free vinyl groups have been used to form cross linkages is still lower than the above-defined specific value of the complex modulus of elasticity.

* * * * *